United States Patent
Kim et al.

(10) Patent No.: US 10,199,226 B2
(45) Date of Patent: Feb. 5, 2019

(54) METHOD FOR MANUFACTURING FLEXIBLE ELECTRODE USING SPUTTERING PROCESS

(71) Applicant: Industry-Academic Cooperation Foundation of Ajou University, Suwon-si, Gyeonggi-do (IL)

(72) Inventors: Chang-Koo Kim, Seoul (KR); Hae-Min Lee, Seoul (KR); Chang-Jin Park, Seoul (KR)

(73) Assignee: Industry-Academic Corporation Foundation of ajou University, Suwon-si (KR)

( * ) Notice: Subject to any disclaimer, the term of this patent is extended or adjusted under 35 U.S.C. 154(b) by 0 days.

(21) Appl. No.: 15/615,855

(22) Filed: Jun. 7, 2017

(65) Prior Publication Data

US 2017/0358454 A1    Dec. 14, 2017

(30) Foreign Application Priority Data

Jun. 13, 2016    (KR) .......... 10-2016-0073440

(51) Int. Cl.
| | |
|---|---|
| H01L 21/28 | (2006.01) |
| H01L 21/768 | (2006.01) |
| H01L 21/02 | (2006.01) |
| H01L 21/44 | (2006.01) |
| H01L 51/00 | (2006.01) |
| H01L 51/52 | (2006.01) |

(52) U.S. Cl.
CPC ........ *H01L 21/28* (2013.01); *H01L 21/02172* (2013.01); *H01L 21/02266* (2013.01); *H01L 21/02631* (2013.01); *H01L 21/44* (2013.01); *H01L 21/76874* (2013.01); *H01L 51/0097* (2013.01); *H01L 51/5203* (2013.01)

(58) Field of Classification Search
None
See application file for complete search history.

(56) References Cited

U.S. PATENT DOCUMENTS

| | | | | |
|---|---|---|---|---|
| 4,329,416 A * | 5/1982 | Tanikawa | ............. | G03G 5/0564 430/133 |
| 2007/0066071 A1* | 3/2007 | Chen | ....................... | C11D 7/08 438/704 |
| 2008/0241996 A1* | 10/2008 | Fujita | .................... | H01L 23/481 438/109 |
| 2009/0155605 A1* | 6/2009 | Lee | ........................ | B01J 21/063 428/432 |
| 2009/0304914 A1* | 12/2009 | Nalla | ..................... | C23C 16/18 427/124 |
| 2016/0073508 A1* | 3/2016 | Chuang | .................. | H05K 3/184 428/601 |

* cited by examiner

*Primary Examiner* — Mounir S Amer
(74) *Attorney, Agent, or Firm* — Vorys, Sater, Seymour & Pease LLP; Mih Suhn Koh

(57) ABSTRACT

There is provided a method for manufacturing a flexible electrode, the method comprising: cleaning a plastic substrate; forming a metal-oxide seed layer on the plastic substrate by sputtering a metal oxide on the plastic substrate; and forming a metal plating layer on the metal oxide seed layer using an electroless plating.

8 Claims, 3 Drawing Sheets

METHOD FOR MANUFACTURING FLEXIBLE ELECTRODE USING SPUTTERING PROCESS

CROSS-REFERENCE TO RELATED APPLICATION

This application claims the benefit of Korean patent application No. 10-2016-0073440 filed on Jun. 13, 2016, the entire content of which is incorporated herein by reference for all purposes as if fully set forth herein.

BACKGROUND

Field of the Present Disclosure

The present invention relates to a method for manufacturing a flexible electrode applicable to a flexible device.

Discussion of Related Art

Conventionally, an electroless plating process of copper (Cu) has generally been used as a method of forming an electrode or wiring on a flexible polymer substrate.

As the flexible polymer substrate, a plastic substrate made of, for example, polyimide (PI), fiber reinforced plastic (FRP), polyethylene terephthalate (PET), and polyethylene naphthalate (PEN) is widely used. Although such a plastic substrate is thin and flexible, the heat resistance and the chemical stability thereof are poor. Currently, as the flexible polymer substrate material, polyimide (PI) and glass fiber reinforced plastic (FRP) have been mainly studied. However, in order to complement optical property and heat resistance, recently, polyethylene terephthalate (PET) is getting popular.

In the case of copper (Cu) electroless plating, a seed layer made of, for example, palladium (Pd), gold (Au), platinum (Pt), ruthenium (Ru), rhodium (Rh), silver (Ag), tin (Sn), etc. is formed on the polymer substrate, which, in turn, is immersed in an electroless plating bath. In this connection, the metal of the seed layer functions as a catalyst, and, thus, copper ions are reduced and precipitated on the seed layer. In this regard, since the noble metal precursor solution is used to form the seed layer, the drying process is accompanied, thereby to incur a long process time. Further, there is a limitation in forming fine line widths. In addition, there is disadvantage of using environmentally harmful chemicals.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure is to provide a method for manufacturing a flexible electrode on a plastic substrate using a metal-oxide seed layer formed by a sputtering process.

In one aspect of the present disclosure, there is provided a method for manufacturing a flexible electrode, the method comprising: cleaning a plastic substrate; forming a metal-oxide seed layer on the plastic substrate by sputtering a metal oxide on the plastic substrate; and forming a metal plating layer on the metal oxide seed layer using an electroless plating.

In one implementation, cleaning the plastic substrate includes applying ultrasonic waves to an acetone solution while immersing the plastic substrate in the acetone solution.

In one implementation, the metal oxide comprises a nickel oxide, wherein the metal plating layer includes a copper (Cu) plating layer.

In one implementation, the sputtering of the metal oxide is performed for 3 to 10 hours.

In one implementation, forming the metal plating layer on the metal oxide seed layer using the electroless plating comprises: providing an electroless plating bath containing therein an aqueous solution containing copper sulfate hydrate, formaldehyde and ethylenediaminetetraacetic acid 4-sodium salt; adjusting pH of the aqueous solution to pH 12 using sodium hydroxide; and placing into the bath the plastic substrate having the metal-oxide seed layer formed thereon.

In one implementation, the electroless plating is performed for at least 25 minutes.

In one implementation, the metal plating layer has a thickness of 1.5 μm to 2.2 μm.

According to the method for producing the flexible electrode according to the present disclosure, since the seed layer for electroless plating is formed by sputtering the metal oxide, a noble metal precursor solution is not used. Therefore, the formation time of the seed layer can be remarkably reduced as compared with the conventional technique of forming the seed layer using the noble metal precursor solution. In addition, the use of environmentally harmful chemicals can be significantly reduced.

In addition, since the seed layer is formed via the metal oxide sputtering process, the plastic substrate is hydrophilized, and, thus, the precision of the plating metal layer formed via the electroless plating process can be remarkably improved.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

Figure 1:
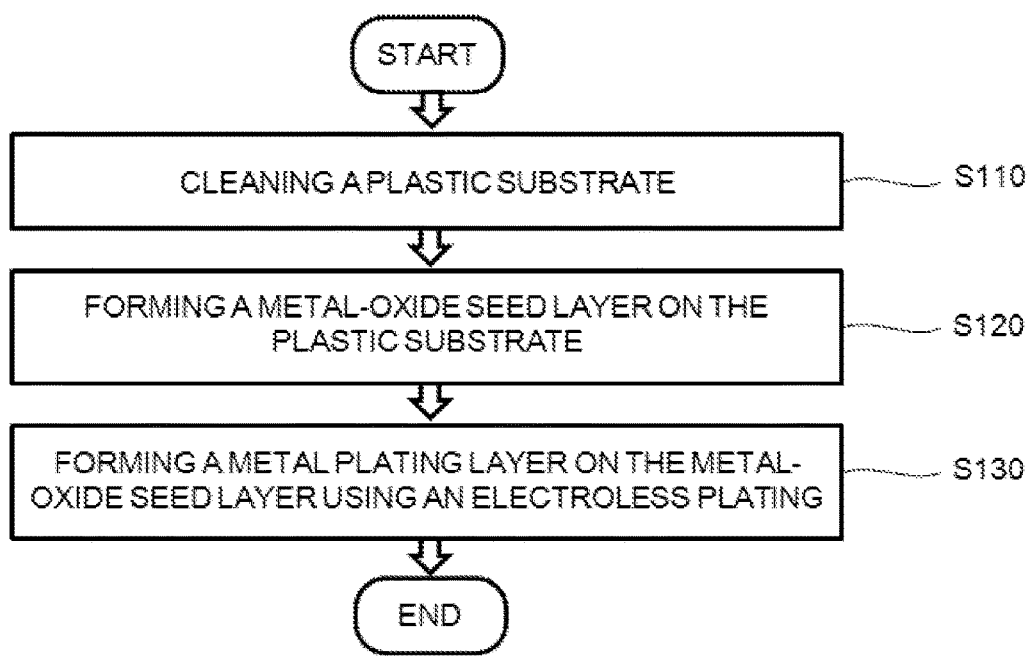
FIG. 1 is a flow chart for explaining a method for manufacturing a flexible electrode according to an embodiment of the present invention.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

FIG. 1 is a flow chart for explaining a method for manufacturing a flexible electrode according to an embodiment of the present invention.

Referring to FIG. 1, a method for manufacturing a flexible electrode according to an embodiment of the present invention may include cleaning a plastic substrate S110; forming a metal-oxide seed layer on the plastic substrate by sputtering a metal oxide on the plastic substrate S120; and forming a metal plating layer on the metal oxide seed layer using an electroless plating S130.

As the plastic substrate, a conventional plastic substrate for a flexible device may be employed without limitation. For example, as the plastic substrate, a polymer substrate made of polyimide (PI), fiber reinforced plastic (FRP), polyethylene terephthalate (PET), or polyethylene naphthalate (PEN) may be used.

In the step of cleaning the plastic substrate S110, the plastic substrate may be immersed in the acetone solution and then ultrasonic waves may be applied to the plastic substrate immersed in the acetone solution. Then, the substrate may be drawn from the solution, washed several times with distilled water, and then dried in a nitrogen atmosphere.

By the cleaning process, not only contaminants stuck to the surface of the plastic substrate due to static electricity are removed, but also the surface of the plastic substrate may be hydrophilized. As a result, the water contact angle of the substrate may be reduced.

In one embodiment, when a polyethylene terephthalate (PET) is used as the plastic substrate and the cleaning process is performed by applying ultrasonic waves for about 5 to 10 minutes, the water contact angle of the plastic substrate may be reduced from 59 degrees to about 45 to 46 degrees. The hydrophilization of the plastic substrate can improve the adhesion and precision of the metal electroless plating layer formed on the substrate using the electroless plating bath.

In the step of forming the metal-oxide seed layer on the plastic substrate S120, the metal-oxide seed layer may be formed through a sputtering process of a metal oxide. In one embodiment, the metal oxide may include a nickel oxide (NiO), and the metal plating layer may include a copper (Cu) plating layer. When the metal oxide seed layer is formed by sputtering the metal oxide on the plastic substrate, the water contact angle of the plastic substrate can be further reduced. This makes it possible to further improve the adhesion and precision of the metal electroless plating layer, and, further, to significantly reduce the formation time of the seed layer as compared with the prior art in which a seed layer is formed using a noble metal precursor solution. Furthermore, the amount of harmful chemicals used for forming the metal oxide seed layer can be significantly reduced.

In one embodiment, in order to form the metal oxide seed layer on the plastic substrate using the sputtering process, the plastic substrate and the nickel oxide target may be placed in a sputtering chamber, and, thereafter, power may be applied to the chamber in an inert gas atmosphere therein to allow the nickel oxide to be sputtered onto the substrate. In this way, the metal oxide seed layer may be formed on the substrate. In one embodiment, for hydrophilization of the plastic substrate surface, the sputtering process may be performed for about 3 to 10 hours.

In the step of forming a metal plating layer on the metal oxide seed layer using an electroless plating S130, the electroless plating may be performed for about 25 minutes or more. For example, the metal plating layer may have a thickness of about 1.5 μm to 2.2 μm.

In one embodiment, in case that the metal electroless plating layer is a cupper electroless plating layer, an electroless plating bath which is formed by adjusting a pH of an aqueous solution containing copper sulfate hydrate, formaldehyde and ethylenediaminetetraacetic acid 4-sodium salt to pH 12 using sodium hydroxide may be used. For forming the cupper electroless plating layer, the plastic substrate having the nickel oxide seed layer formed thereon may be placed into the bath heated to a temperature of about 70° C. for a predetermined time.

According to the method for producing the flexible electrode according to the present disclosure, since the seed layer for electroless plating is formed by sputtering the metal oxide, a noble metal precursor solution is not used. Therefore, the formation time of the seed layer can be remarkably reduced as compared with the conventional technique of forming the seed layer using the noble metal precursor solution. In addition, the use of environmentally harmful chemicals can be significantly reduced.

In addition, since the seed layer is formed via the metal oxide sputtering process, the plastic substrate is hydrophilized, and, thus, the precision of the plating metal layer formed via the electroless plating process can be remarkably improved.

Figure 2:
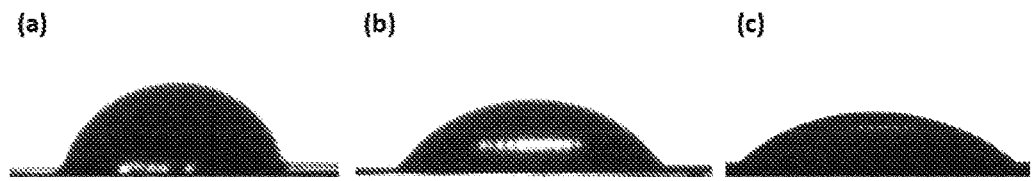
FIG. 2 is photographs of water contact angles of a PET substrate measured (a) before a cleaning process, (b) after an acetone-ultrasonic cleaning process, and (c) after forming a nickel oxide seed layer via a sputtering process thereof on the PET substrate for 3 hours.

FIG. 2 is photographs of water contact angles of a PET substrate measured (a) before a cleaning process, (b) after an acetone-ultrasonic cleaning process, and (c) after forming a nickel oxide seed layer via a sputtering process thereof on the PET substrate for 3 hours.

Referring to FIG. 2, the water contact angle of the PET substrate before the cleaning process was about 59°. However, the water contact angle of the PET substrate was reduced to about 45° after the cleaning process in which while the PET substrate is immersed in an acetone solution, the ultrasonic waves is applied thereto for about 6 minutes.

Furthermore, after the cleaning process, when the nickel oxide seed layer was formed on the substrate by the sputtering process for 3 hours, the water contact angle of the PET substrate was reduced to about 35°.

Therefore, when cleaning the plastic substrate and, subsequently, forming the metal oxide electroless plating seed layer on the plastic substrate through the sputtering process according to the present invention, hydrophilization of the surface of the plastic substrate proceeds, and, thus, adhesion and accuracy of the metal electroless plating layer to be formed may be remarkably improved.

Figure 3:
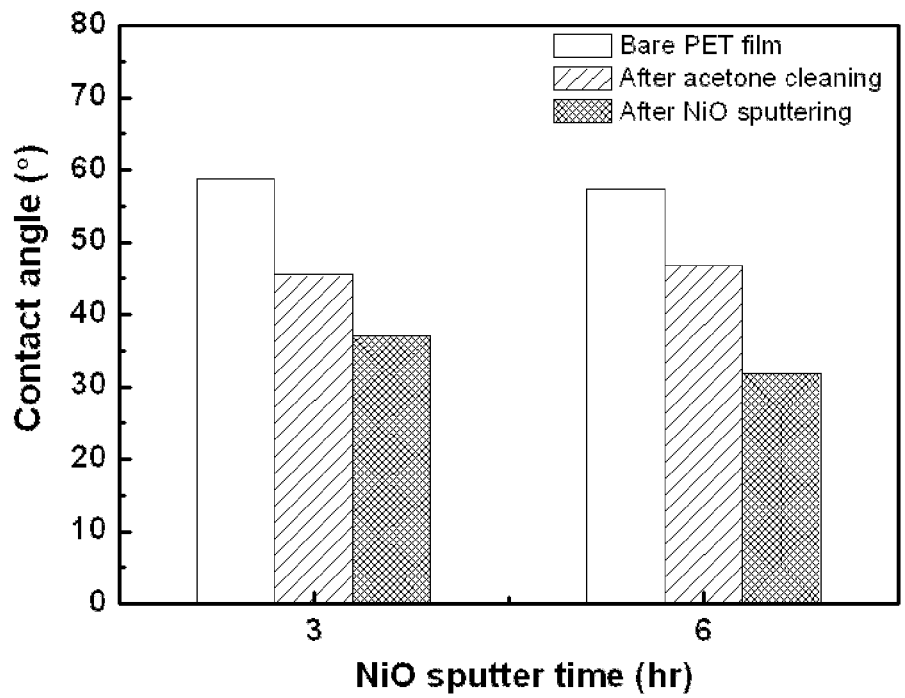
FIG. 3 is a graph for explaining a water contact angle of a PET substrate based on times for the RF sputtering of the nickel oxide.

FIG. 3 is a graph for explaining a water contact angle of a PET substrate based on times for the RF sputtering of the nickel oxide.

Referring to FIG. 3, when the RF sputtering duration for the nickel oxide was 3 hours under the same conditions, the water contact angle of the PET substrate was about 35° to about 36°. Meanwhile, when the sputtering time was 6 hours, the water contact angle of the PET substrate was found to be about 32°.

That is, as the sputtering time increases, the nickel oxide content on the substrate surface increases, and, thus, the water contact angle of the PET substrate decreases. However, the decrease amount is not significant. Therefore, when the RF sputtering time for the nickel oxide is 3 hours or more, it is believed that the surface of the PET substrate is sufficiently hydrophilized.

Figure 4:
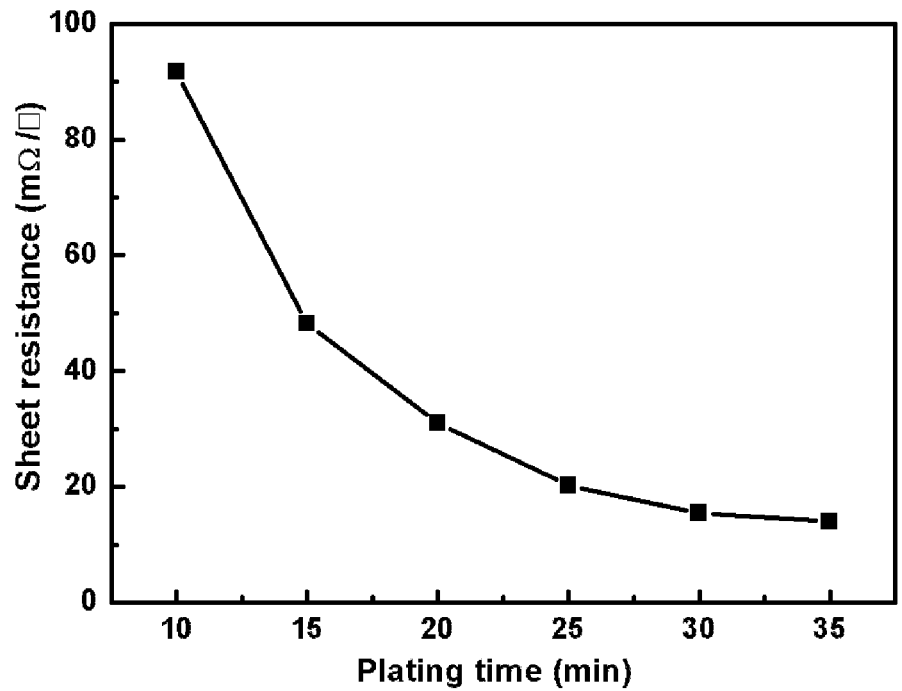
FIGS. 4 to 6 show changes in a sheet resistance, a thickness, and a resistivity of the copper plating layer respectively based on times for a copper electroless plating, for a PET substrate having a nickel oxide seed layer formed thereon via a 3-hours RF sputtering process.
Figure 5:
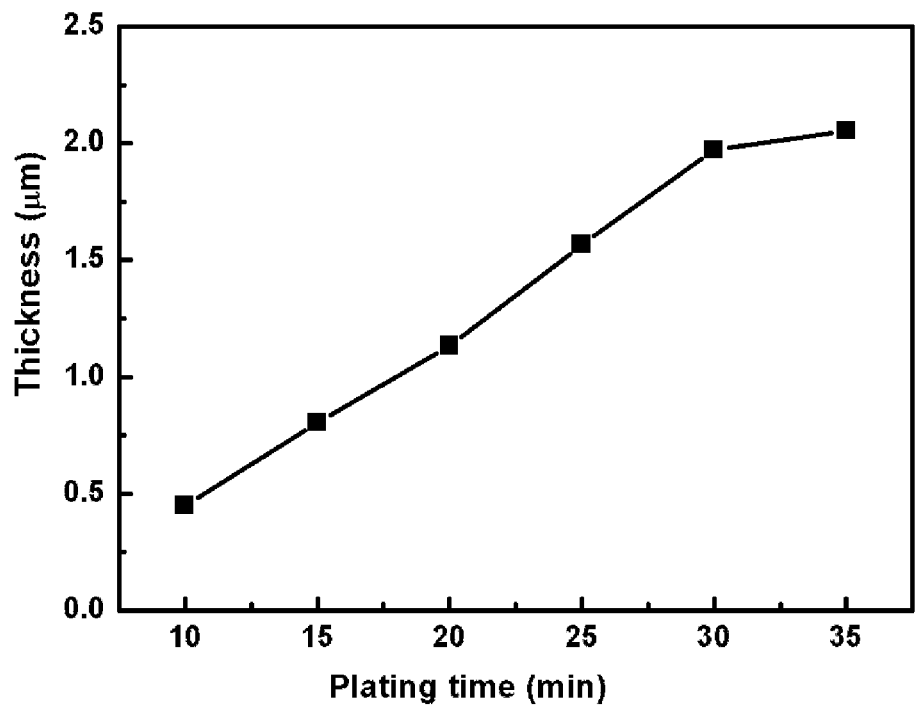
Figure 6:
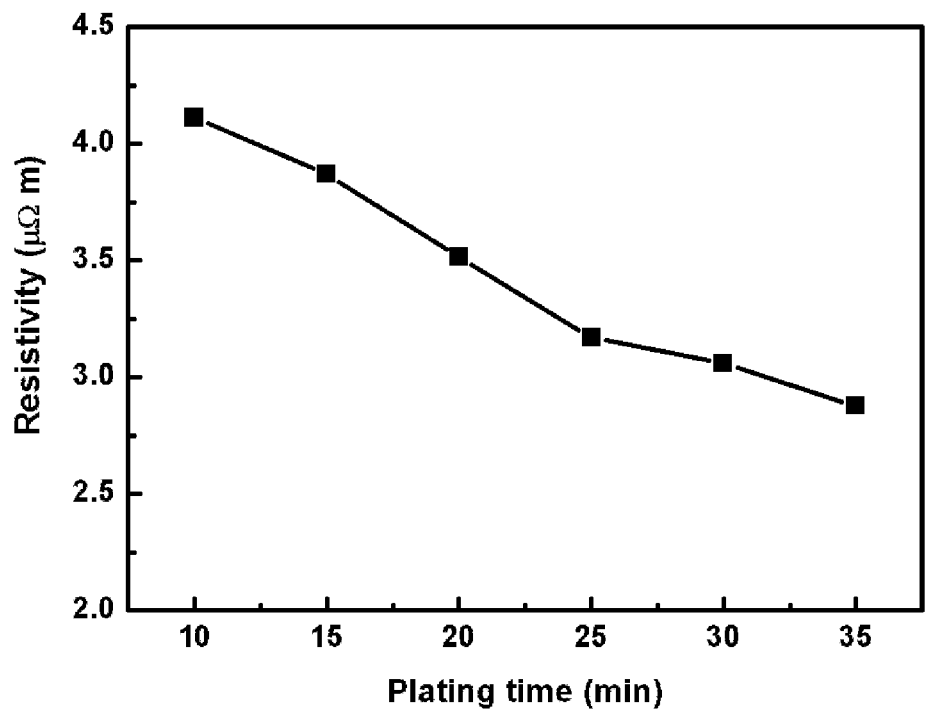

FIGS. 4 to 6 show changes in a sheet resistance, a thickness, and a resistivity of the copper plating layer respectively based on times for a copper electroless plating, for a PET substrate having a nickel oxide seed layer formed thereon via a 3-hours RF sputtering process.

Referring to FIG. 4, when the electroless plating was performed for about 30 minutes, the sheet resistance of the copper electroless plating layer reached about 18 mΩ/□. However, thereafter, when the electroless plating time further increased, the sheet resistance of the copper electroless plating layer did not change significantly.

Referring to FIG. 5, when the electroless plating was performed for about 30 minutes, the thickness of the electroless copper plating layer rapidly increased with time. However, when the electroless plating time was more than 30 minutes, the thickness of the electroless copper plating layer increased relatively slowly.

Referring to FIG. 6, when the electroless plating was performed for about 25 minutes, the resistivity of the electroless copper plating layer rapidly decreased with time. However, when the electroless plating time was more than 25 minutes, the resistivity of the electroless copper plating layer decreased relatively slowly.

Taking all of the above findings into consideration, it is preferable that the electroless plating is performed for about 25 minutes or more, and more preferably for about 30 minutes or more.

It is to be understood that while the present disclosure has been particularly shown and described with reference to the exemplary embodiments thereof, the disclosure is not limited to the disclosed exemplary embodiments. On the contrary, it will be understood by those skilled in the art that various modifications may be made without departing from the spirit and scope of the present disclosure.

It is understood by those skilled in the art that various variants and alternatives may be selected in the present disclosure without departing from the spirit or scope of the present disclosure. Accordingly, it is intended that the present disclosure covers the modifications and variations when they come within the scope of the appended claims and their equivalents.

In the present specification, a reference has been made to all the device and method disclosures. In this connection, descriptions of the device and method disclosures may be applied to each other in a supplementing manner.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A method for manufacturing a flexible electrode, the method comprising:
   cleaning a plastic substrate;
   forming a nickel oxide seed layer on the plastic substrate; and
   forming a copper plating layer on the nickel oxide seed layer using an electroless plating,
   wherein during the electroless plating of the copper plating layer, nickel of the nickel oxide seed layer catalyzes copper ions to reduce and precipitate on the nickel oxide seed layer.

2. The method of claim 1, wherein cleaning the plastic substrate comprises:
   immersing the plastic substrate in an acetone solution; and
   applying ultrasonic waves to the plastic substrate immersed in the acetone solution.

3. The method of claim 2, wherein the ultrasonic waves are applied for about 5 to 10 minutes.

4. The method of claim 1, wherein the nickel oxide seed layer is formed by sputtering a nickel oxide on the plastic substrate.

5. The method of claim 4, wherein the sputtering of the nickel oxide is performed for about 3 to 10 hours.

6. A method for manufacturing a flexible electrode, the method comprising:

cleaning a plastic substrate;
forming a metal oxide seed layer on the plastic substrate; and
forming a metal plating layer on the metal oxide seed layer using an electroless plating,
wherein the metal oxide comprises a nickel oxide, and the metal plating layer comprises a copper (Cu) plating layer, and
wherein forming the metal plating layer on the metal oxide seed layer comprises:
adjusting pH of the aqueous solution containing copper sulfate hydrate, formaldehyde and ethylenediaminetetraacetic acid 4-sodium salt to pH 12 using sodium hydroxide to form an electroless plating solution; and
placing the plastic substrate having the metal-oxide seed layer formed thereon into the electroless plating solution.

7. The method of claim 6, wherein the electroless plating is performed for about 25 minutes or more.

8. The method of claim 7, wherein the metal plating layer has a thickness of about 1.5 μm to 2.2 μm.

* * * * *